(12) United States Patent
Inanami et al.

(10) Patent No.: US 6,718,532 B2
(45) Date of Patent: Apr. 6, 2004

(54) CHARGED PARTICLE BEAM EXPOSURE SYSTEM USING APERTURE MASK IN SEMICONDUCTOR MANUFACTURE

(75) Inventors: Ryoichi Inanami, Yokohama (JP); Shunko Magoshi, Yokohama (JP); Atsushi Ando, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 10/080,081

(22) Filed: Feb. 22, 2002

(65) Prior Publication Data
US 2002/0162088 A1 Oct. 31, 2002

(30) Foreign Application Priority Data
Feb. 23, 2001 (JP) ........................ 2001-048495
Mar. 28, 2001 (JP) ........................ 2001-093869

(51) Int. Cl.[7] .............................................. G06F 17/50
(52) U.S. Cl. ...................... 716/19; 430/394; 716/20; 716/21
(58) Field of Search .............................. 716/19, 20, 21; 430/394

(56) References Cited

U.S. PATENT DOCUMENTS 5,812,412 A * 9/1998 Moriizumi et al. ........... 716/21
6,403,291 B1 * 6/2002 Kawashima et al. ........ 430/394

FOREIGN PATENT DOCUMENTS

| JP | 9-258429 | 10/1997 |
| JP | 2001-117214 | 4/2001 |
| JP | 2001-274077 | 10/2001 |

OTHER PUBLICATIONS

U.S. patent application Ser. No. 09/817,270, Ryoichi Inanami et al., filed Mar. 27, 2001.

* cited by examiner

Primary Examiner—Matthew Smith
Assistant Examiner—Thuan Do
(74) Attorney, Agent, or Firm—Finnegan, Henderson, Farabow, Garrett & Dunner, L.L.P.

(57) ABSTRACT

A charged particle beam exposure method for shaping a charged particle beam by using an aperture mask having character apertures corresponding to the character shapes extracted from a semiconductor device pattern, the method comprises arranging the character apertures in the aperture mask, each of the character apertures having a shape corresponding to character shapes extracted from a standard cell pattern used for designing a semiconductor device, and varying the shape of the charged particle beam according to the outer shape of each of the character apertures, thereby applying the shaped charged particle beam to the character apertures.

5 Claims, 11 Drawing Sheets

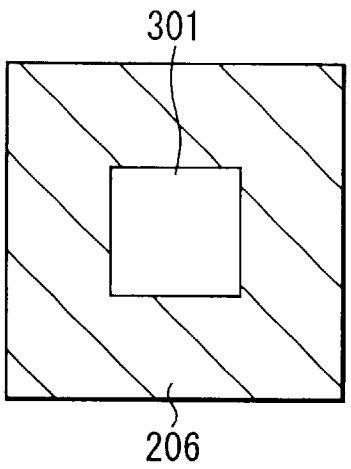 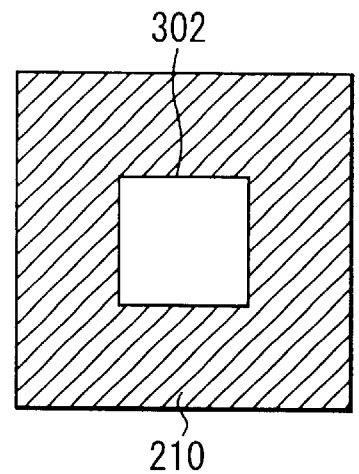
FIG. 3A  FIG. 3B
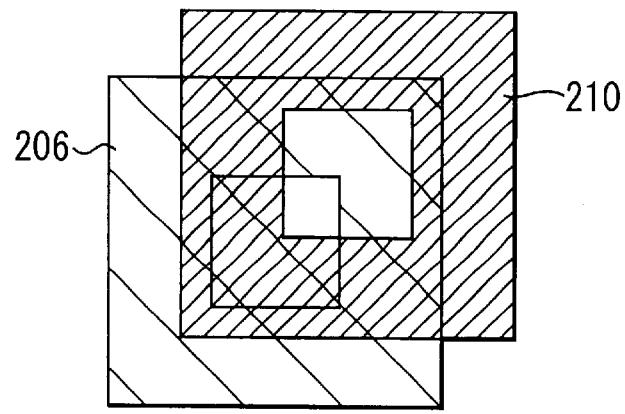
FIG. 4A
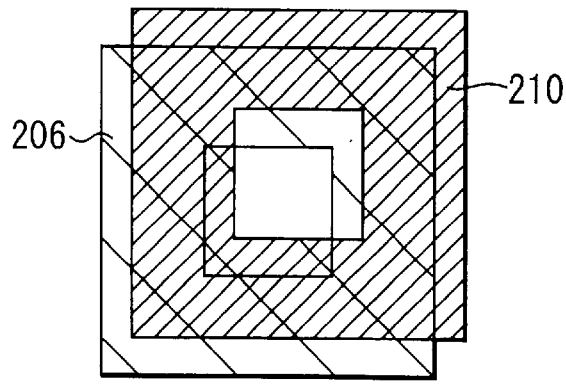
FIG. 4B

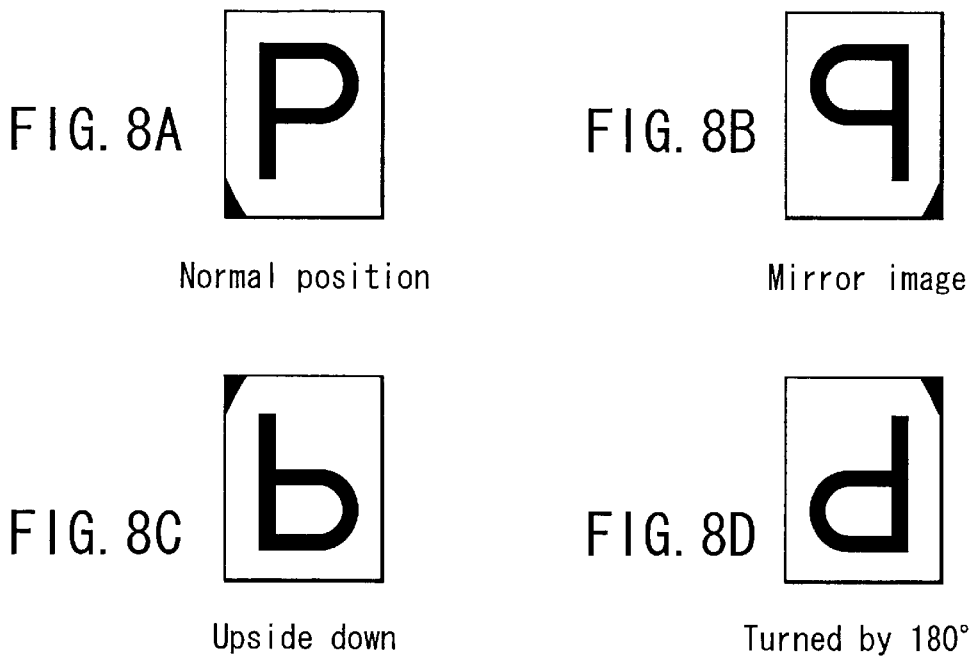
FIG. 8A Normal position
FIG. 8B Mirror image
FIG. 8C Upside down
FIG. 8D Turned by 180°
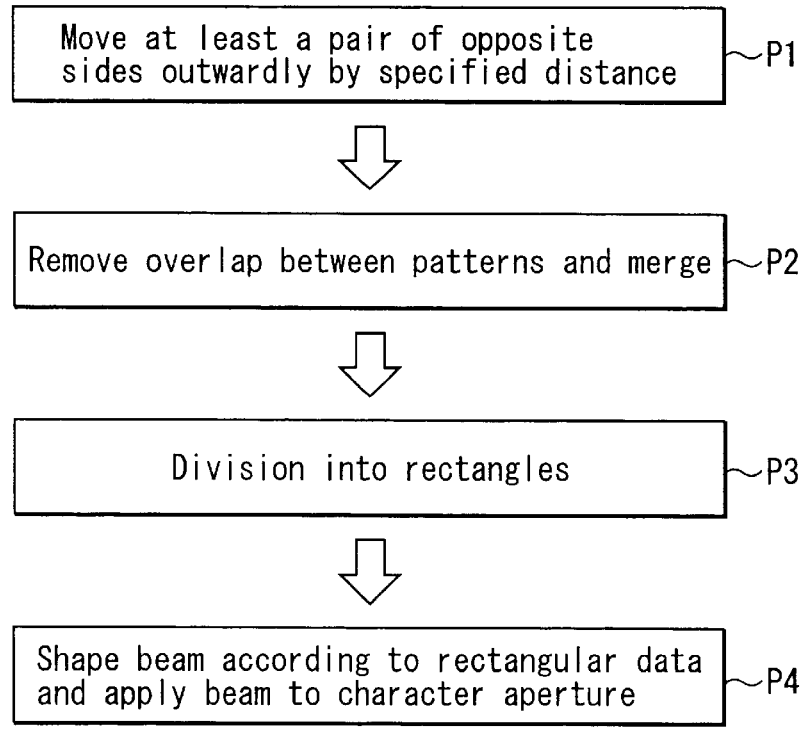
FIG. 9

CHARGED PARTICLE BEAM EXPOSURE SYSTEM USING APERTURE MASK IN SEMICONDUCTOR MANUFACTURE

CROSS-REFERENCE TO RELATED APPLICATIONS

This application is based upon and claims the benefit of priority from the prior Japanese Patent Applications No. 2001-048495, filed Feb. 23, 2001; and No. 2001-093869, filed Mar. 28, 2001, the entire contents of both of which are incorporated herein by reference.

BACKGROUND OF THE INVENTION

1. Field of the Invention

This invention relates to a character projection type charged particle beam exposure system using an aperture mask. More particularly, the present invention relates to a charged particle beam exposure method, an exposure data processing method, an aperture mask, a method of manufacturing such an aperture mask and a recording medium storing an exposure program.

2. Description of the Related Art

Photolithography has been utilized broadly for manufacturing semiconductor devices because of simplicity of manufacturing process, low cost and other advantages. Technological innovations are constantly on the way. Microdevices having a size less than 0.2 $\mu$m may become available recently by using short wavelength laser beams (KrF excimer lasers). Efforts for developing ArF excimer lasers and Levenson type phase shift masks are being paid for the purpose of further fine pattern technology. They are expected to operate as mass production lithography tools corresponding to the 0.13 $\mu$m rule. However, there are a number of problems to be dissolved and a long time may be needed before dissolving the problems. It is a matter of serious concern if the expected development of new mass production tools can keep pace with the desired fine patterning of devices.

On the other hand, electron beam lithography is the most expected candidate for replacing photolithography and it has been proved that it can deal with a dimension of 0.01 $\mu$m by using a narrowed beam. While it may not be accompanied by any problem from the viewpoint of fine patterning, there may arise a problem of throughput when it is used for mass production tools for manufacturing semiconductor devices. More specifically, it is a time consuming operation to draw fine patterns one by one by means of electron beam lithography mainly because of a long exposure time. Apparatus employing a partial collective exposure method (character projection technique: CP technique) of collectively exposing repetitively appearing parts of an LSI pattern to electron beams have been developed in an attempt for dissolving the problem of consumption of time.

However, the use of such an apparatus is still not sufficient for catching up to the throughput of a manufacturing process using photolithography. This is because the number of stencil masks (character apertures) that are used for shaping a beam to make it conform to the shape of a repetitive pattern (a hundred at most) is by far short of the number of stencil masks necessary for exposing logic devices in order to realize a commercially feasible throughput (several hundreds to several thousands).

However, when manufacturing logic devices designed on the basis of standard cells (SCs) such as ASICs by using an electron beam (EB) exposure system, the number of EB shots can be efficiently reduced and consequently the throughput can be raised by using a character projection (CP) technique and extracting the character shape to be used for the exposure operation from the standard cell patterns that are used in the design stage.

Referring to FIG. 16 of the accompanying drawing, the electron beam generated by an electron gun 901 is made to show a rectangular cross section by a first shaping aperture mask 902 and selectively applied to a character aperture which is formed in a CP aperture mask 904 through a character selection deflector 903 and which has the shape of a character designed to operate as unit of exposure. As a result, the shaped electron beam is applied to a desired position of sample 907, which may typically be a resist film coated on a semiconductor substrate, by way of a reduction lens 905 that reduces the dimensions of the cross section of the shaped electron beam. In FIG. 16, reference numeral 906 denotes an objective deflector.

In the case where the CP aperture mask 904 does not include a desired aperture pattern, rectangular apertures for variable shaping may be employed. The pattern to be exposed is divided into a plurality of rectangles. In correspondence to the divided rectangles, the rectangular beam shaped by the first shaping aperture mask 902 is displaced by a desired distance and applied to the variable shaping aperture of the CP aperture mask, thereby producing respective rectangular beams each having a desired shape.

Thus, the number of patterns to be used for the exposure process that uses a variably shaped beam can be reduced for exposing a semiconductor device pattern designed on the basis of standard cells by providing the CP aperture mask with as many character apertures as possible then the character apertures show respective character shapes extracted from standard cells.

However, this method requires a shot for each standard cell. In other words, the number of EB shots cannot be less than the number of standard cells placed in the semiconductor pattern if the exposure operation is carried out ideally with the character projection technique.

Generally, a CP aperture mask is designed in a manner as illustrated in FIG. 17. Referring to FIG. 17, character-shaped apertures, or character apertures 1003 are arranged in each aperture block 1002 where any of the character apertures may be selected simply by electromagnetically deflecting the beam in a portion of the CP aperture mask 1001. The character apertures are two-dimensionally arranged in an array for every each largest beam size to be applied the aperture mask. In other words, a region corresponding to the largest beam size is allocated to any character aperture in the aperture block.

Therefore, with the known arrangement of CP aperture mask, the areas of the character apertures of the CP aperture mask (covering ratio) vary from place to place to make it difficult not only to effectively utilize the total area of the CP aperture mask but also to realize a high precision processing operation.

On the other hand, as an ingenious application of the partial collective exposure method, the applicant of this patent application has proposed a method of transferring only a part of apertures by applying a beam to it having a device pattern shape provided on a character aperture (Japanese Patent Application No. 2000-88967). With the proposed method, a rectangular beam shaped by first and second apertures (beam shaping apertures) is applied to a third aperture (character aperture) to transfer part of the profile of the aperture and exposing it to an electron beam.

A desired number of hole patterns can be collectively transferred by applying this exposure method to a contact hole of a semiconductor device. Therefore, the number of exposures can be remarkably reduced if compared with a variable beam shaping method of exposing holes one by one. However, while exposure data are required for selectively irradiating character apertures with an electron beam by means of this exposure method, no method of preparing exposure data has been developed to date.

BRIEF SUMMARY OF THE INVENTION

According to the first aspect of the present invention, there is provided a character projection type charged particle beam exposure method for shaping a charged particle beam by using an aperture mask provided with character apertures corresponding to character shapes extracted from a semiconductor device pattern, which comprises:

arranging character apertures in the aperture mask, each of the character apertures having a shape corresponding to character shapes extracted from standard cells used for designing a semiconductor device; and varying the shape of the charged particle beam according to the outer shape of each of the character apertures to apply the shaped charged particle beam to the character apertures.

According to the second aspect of the present invention, there is provided a character projection type charged particle beam exposure method for shaping a charged particle beam by using an aperture mask provided with character apertures corresponding to character shapes extracted from a semiconductor device pattern, which comprises:

arranging character apertures in the aperture mask, each of the character apertures having a shape corresponding to character shapes extracted from a pattern of a combination of neighboring standard cells in a designed semiconductor device pattern used for designing a semiconductor device; and shaping the charged particle beam according to the outer shape of each of the character apertures to apply the shaped charged particle beam thereto.

According the third aspect of the present invention, there is provided a charged particle beam exposure method for transferring a plurality of aperture patterns simultaneously onto a sample by selectively applying a charged particle beam to character apertures each having a predetermined shape, which comprises:

outwardly moving at least a pair of opposite sides of a design pattern by a specified distance;

removing the overlap between patterns produced by the moving step and merging the patterns;

dividing the patterns obtained by the merging step into a plurality of rectangles;

shaping to charged particle beam depending upon the rectangular data obtained by the dividing step; and applying the shaped beam to a plurality of aperture patterns.

According to the fourth aspect of the present invention, there is provided an aperture mask used for a character projection type charged particle beam exposure, which comprises character apertures each having an opening shape corresponding to a shape of a character extracted from standard cells used for designing a semiconductor device, each of the character apertures being arranged according to respective shapes.

According to the fifth aspect of the present invention, there is provided a method of designing an aperture mask, which comprises:

extracting a shape of a character from the patterns of standard cells used for designing a semiconductor device; and arranging character apertures in the aperture mask according to their shapes, each of the character apertures having a shape corresponding to the shape of the extracted character.

According to the sixth aspect of the present invention, there is provided a method of producing exposure data used for a charged particle beam exposure for simultaneously transferring a plurality of aperture patterns on a sample by selectively applying a charged particle beam to character apertures including periodically arranged aperture patterns and for defining the shape of the charged particle beam to be applied to the character apertures, which comprises:

outwardly moving at least a pair of opposite sides of a design pattern by a specified distance;

removing the overlap between patterns produced by the moving step and merging the patterns;

dividing the patterns obtained by the merging step into a plurality of rectangles; and providing the rectangles obtained by the dividing step as exposure data.

According to the seventh aspect of the present invention, there is provided a computer-readable recording medium which stores a program for controlling a charged particle beam exposure system by means of a computer and for selectively applying a charged particle beam to character apertures including periodically arranged aperture patterns with predetermined shapes, thereby simultaneously transferring the aperture patterns to a sample, the program controlling the computer to execute the followings:

outwardly moving at least a pair of opposite sides of a design pattern by a specified distance;

removing the overlap between patterns produced by the moving step and merging the patterns;

dividing the patterns obtained by the merging step into a plurality of rectangles;

shaping the charged particle beam depending upon the rectangular data obtained by the dividing step; and applying the shaped beam to a plurality of aperture patterns.

BRIEF DESCRIPTION OF THE DRAWINGS

FIGS. 3A and 3B are illustrations showing an aperture of a first shaping aperture mask and that of a second shaping aperture mask;

FIGS. 4A and 4B are illustrations of shaping an electron beam using the first and second shaping aperture masks respectively;

FIGS. 8A through 8D are schematic illustrations of patterns directed in different ways according to the standard cells;

FIG. 9 is a flow chart showing a procedure of preparing electron beam exposure data according to a third embodiment of the invention;

DETAILED DESCRIPTION OF THE INVENTION

Now, embodiments of the present invention will be described in detail by referring to the accompanying drawings.

Figure 1:
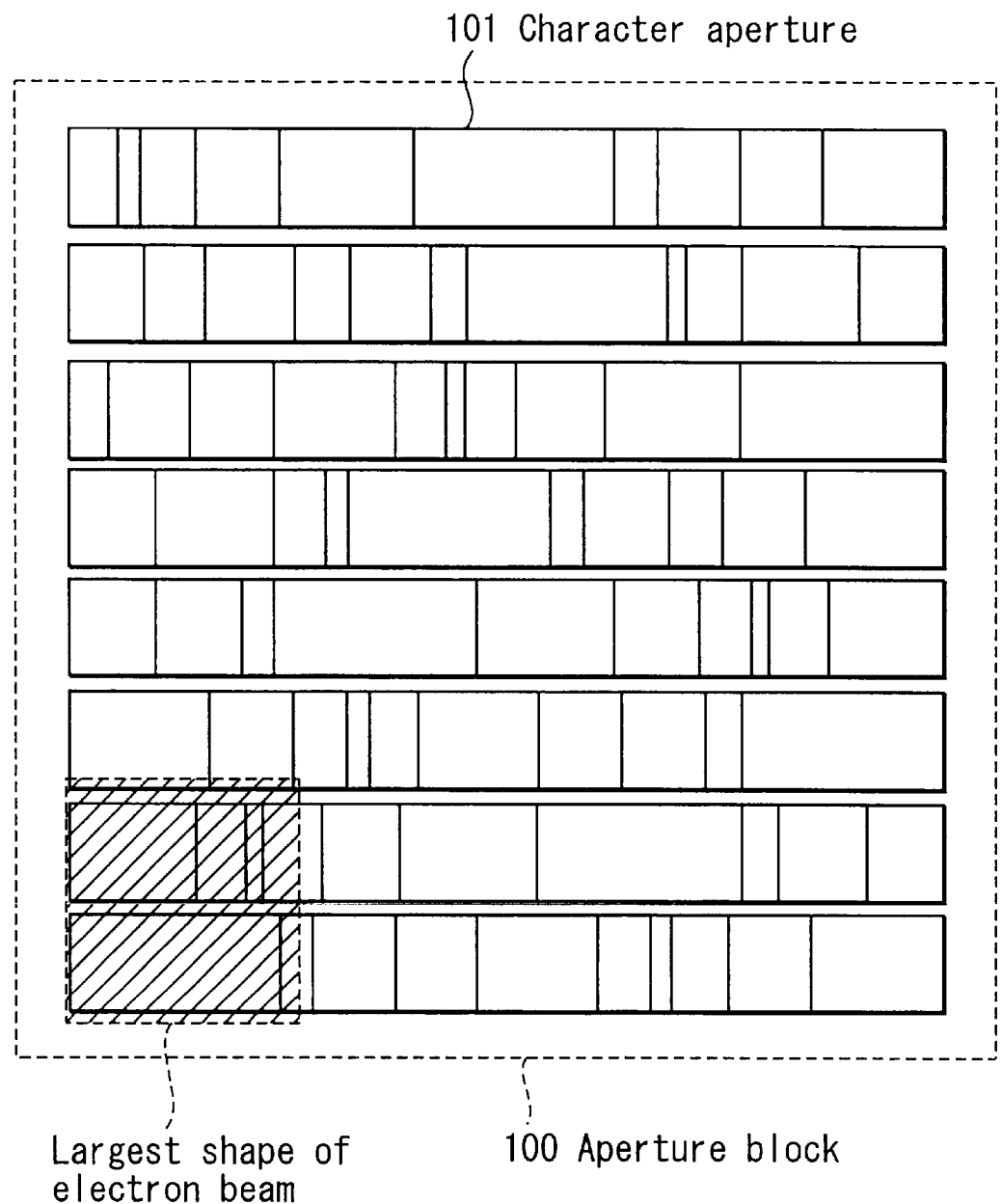
FIG. 1 is a plan view schematically showing a character aperture mask according to a first embodiment of the invention.

FIG. 1 is a schematic plan view showing a character aperture mask according to a first embodiment of the invention.

As shown in FIG. 1, character apertures 101 are arranged in an aperture block 100 of a character aperture mask. Each of the character apertures 101 corresponds to the pattern of a standard cell. The character apertures 101 are arranged according to their outer shapes.

Therefore, according to outer shapes of the character apertures 101, many character apertures can be arranged in the aperture mask as compared with conventional aperture mask, because character apertures having respective shapes are arranged in the aperture block.

Additionally, since the area (cover ratio) occupied by the character apertures is defined for each specific part of the aperture mask, very precise processing can be obtained in dry etching during producing the character aperture mask.

Now, an exposure system required for using the character aperture mask of FIG. 1 will be described below.

Figure 2:
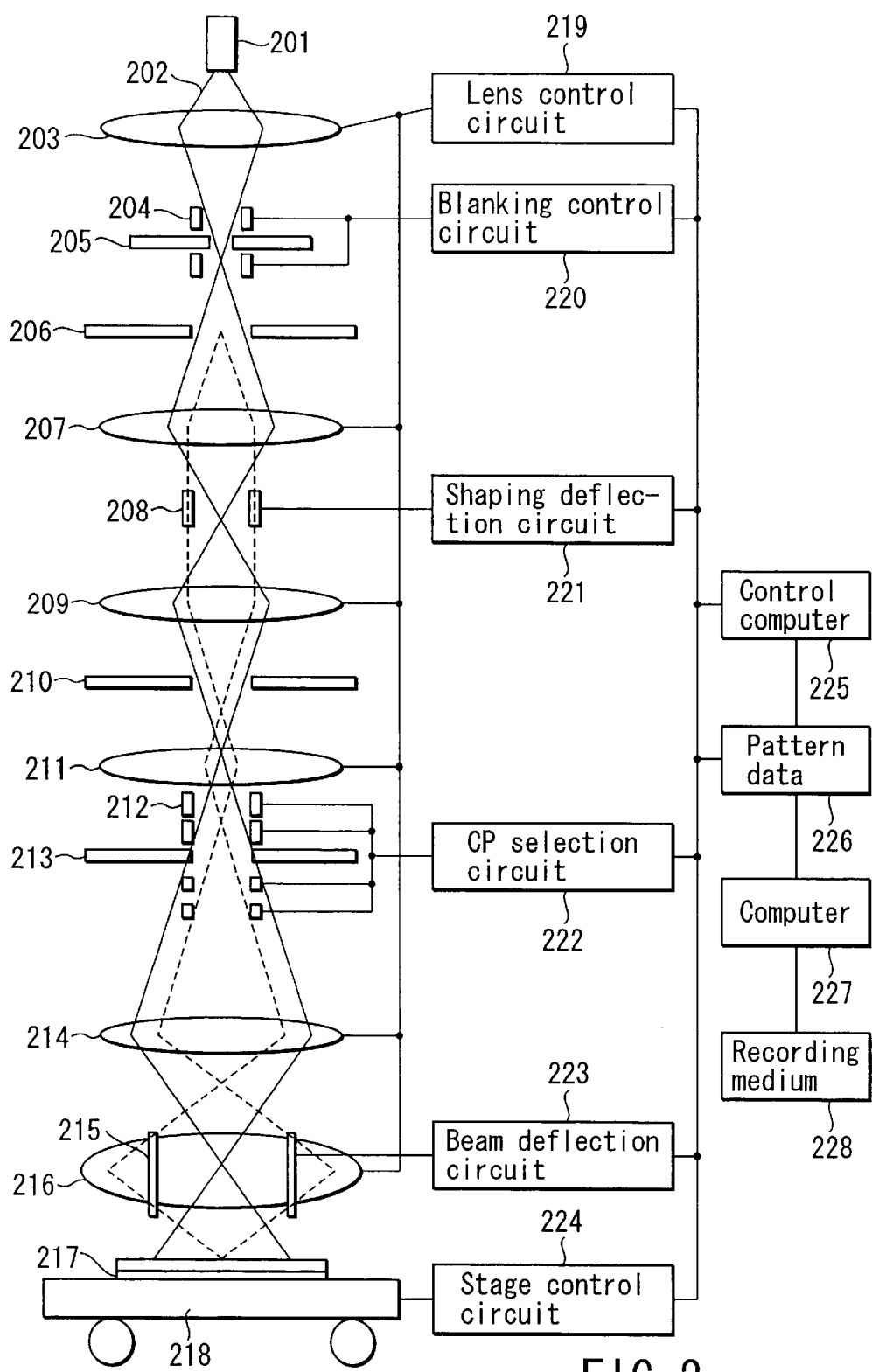
FIG. 2 is a schematic illustration showing an electron beam (EB) exposure system used for the first embodiment.

FIG. 2 is a schematic illustration showing an electron beam (EB) exposure system that can be used for the first embodiment of the invention.

Referring to FIG. 2, an electron beam 202 emitted from an electron gun 201 is regulated to a desired current density by a condenser lens 203 and is shaped by a first shaping aperture mask 206. As shown in FIG. 3A, the first aperture mask 206 has an aperture 301 whose shape is rectangular.

The electron beam 202 shaped by the first shaping aperture mask 206 is focused and projected onto a second shaping aperture mask 210 by means of first and second projection lenses 207 and 209. As shown in FIG. 3B, the second aperture mask 210 also includes an aperture 302 which is rectangular in shape.

A shaping deflector 208 for defining the optical overlap of the first shaping aperture mask 206 and the second shaping aperture mask 210 is disposed between the first and second projection lenses 207 and 209. As shown in FIGS. 4A and 4B, the electron beam 202 is shaped to a desired rectangular shape by the optical overlap of the first and second shaping aperture masks 206 and 210.

The electron beam 202 shaped to the desired shape by the first and second shaping aperture masks 206 and 210 is then focused and projected onto a character aperture mask 213 through a third projection lens 211.

The electron beam 202 is deflected by a selective deflector 212 to a position where the character apertures to carry out the exposure are arranged, and passes through the character aperture, so that the electron beam 202 is shaped to obtain a desired shape. After passing through the character aperture mask 213, the electron beam 202 is turned back to the optical axis by means of the selective deflector 212 arranged below the character aperture mask. Then, the electron beam 202 that has passed through the character aperture mask 213 is demagnified and focused by an imagery lens system comprising a demagnification lens 214 and an objective lens 216, thereby transferring a desired pattern onto a wafer 217. The position of the beam on the wafer 217 is deflected and defined by means of an objective deflector 215. As stage 218 is moved, the entire surface of the wafer 217 can be exposed.

In order not to expose an unwanted position during setting to beam position on the wafer 217, the electron beam 202 is deflected by a blanking deflector 204 and interrupted by a blanking aperture mask 205.

The value of each lenses are controlled by a lens control circuit 219. The blanking of the electron beam 202 is controlled by a blanking control circuit 220. The shaping deflector 208 for defining the shape of the rectangular beam is controlled by a shaping deflection circuit 221. The selection of a character aperture on the character aperture mask 213 is controlled by a selection circuit 222. The deflection position of the beam on the wafer is controlled by a beam deflection circuit 223. The operation of driving the stage is controlled by a stage control circuit 224.

The lens control circuit 219, the blanking control circuit 220, the shaping deflection circuit 221, the character selection circuit 222, the beam deflection circuit 223 and the stage control circuit 224 are controlled by pattern data 226 and control computer 225.

The pattern data 226 is controlled by a computer 227 for controlling the EB exposure system, while the computer 227 is controlled by a recording medium 228 storing programs therefor.

Thus, each outer shape of the character apertures on the character aperture mask can be made to obtain a desired rectangle by means of the exposure system.

Figure 17:
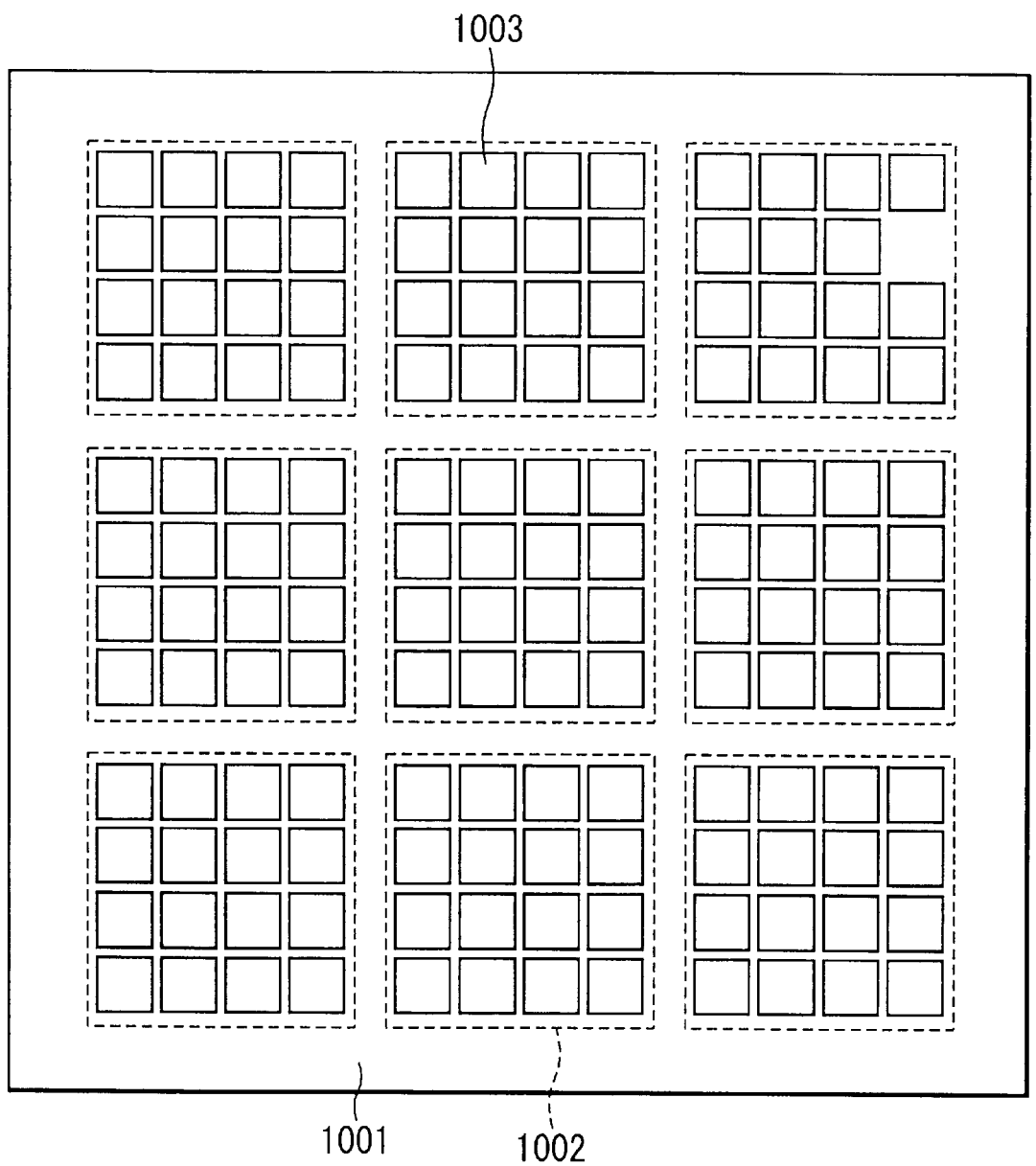
FIG. 17 is a schematic illustration showing a conventional aperture mask.

Therefore, the character apertures as shown in FIG. 1 can be arranged for every outer size of standard cells. While only sixteen character apertures are arranged in a conventional aperture block as shown in FIG. 17, eighty different character apertures can be arranged in the aperture block of the mask as shown in FIG. 1. Then, a large number of standard cells can be supplied to the character aperture block as character apertures. As a result, the rate of the exposure due to the variably shaped beam can be reduced to greatly reduce the total number of shots.

Figure 5:
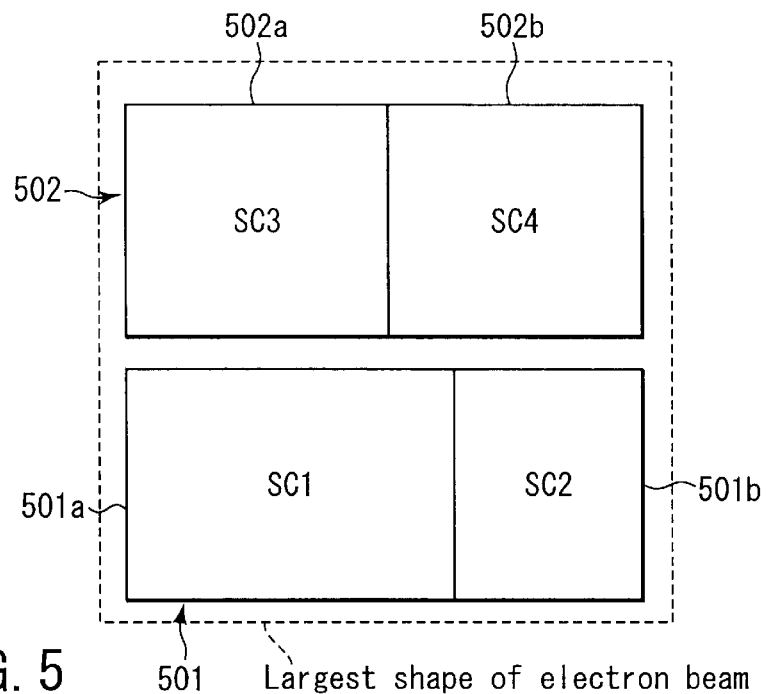
FIG. 5 is a schematic illustration showing character apertures formed in a character aperture mask.

As shown in FIG. 5, it can be possible to arrange the character apertures 501 and 502, extracted from neighboring standard cells (SC1 and SC2, SC3 and SC4) in a semiconductor device pattern, in the character aperture mask. If the size of the extracted character apertures is within the largest size of the electron beam, a plurality of standard cells can be exposed by a single shot. Note that, in FIG. 5, 501a denotes the area corresponding to SC1 and 501b denotes the area corresponding to SC2, while 502a denotes the area corresponding to SC3 and 502b denotes the area corresponding to SC4.

Figure 6A:
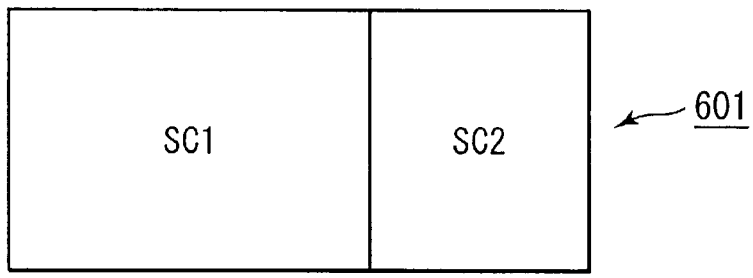
FIGS. 6A through 6F are schematic illustrations of patterns formed by using the character apertures shown in FIG. 5.
Figure 6B:
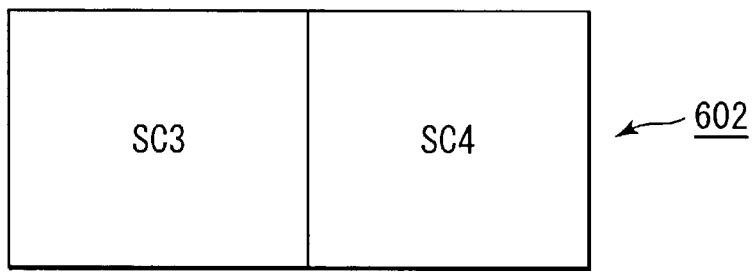
Figure 6C:
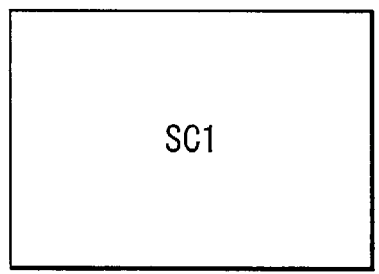
Figure 6D:
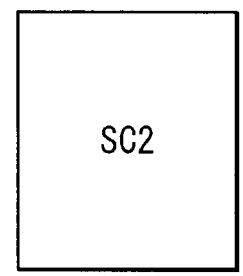
Figure 6E:
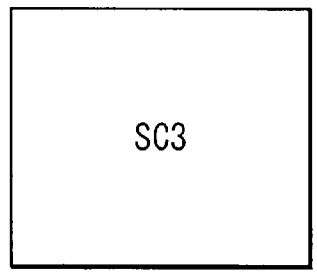
Figure 6F:
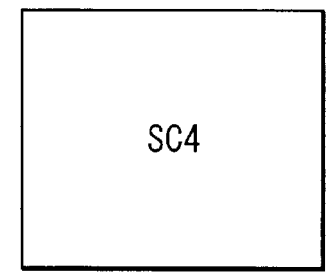

The character apertures shown in FIG. 5 can be provided according to the character shape of the electron beam as shown in FIGS. 6A through 6F. Referring to FIGS. 6A and 6B, a pattern 601 is provided by collectively applying the electron beam to the character aperture (SC1 and SC2) 501, while the pattern 602 is formed by collectively applying the electron beam to the character aperture (SC3 and SC4) 502. Alternatively, the character apertures can be formed in a manner as illustrated in FIGS. 6C through 6F. Referring to FIGS. 6C through 6F, the electron beam is selectively applied to any one of the regions 501a, 501b of the character aperture 501 and the regions 502a, 502b of the character aperture 502, thereby producing patterns 603, 604, 605, 606.

The number of shots required for forming a gate layer pattern of a functional block of an ASIC product by means of such an electron beam exposure was calculated.

In this case, four masks were employed.

Mask A is conventional CP mask in which one character aperture is disposed within each predetermined area.

Mask B is a mask in which character apertures are arranged according to their respective outer shapes.

Mask C is a mask in which character apertures are arranged by extracting combinations of neighboring standard cells from semiconductor device pattern data so as to be contained within the largest beam size of the electron beam, taking the directions of the standard cells (properly arranged and inverted) into consideration, and arranging character apertures extracted from the combined patterns of a plurality of standard cells that appear more than ten times out of all the pattern data.

Mask D is a mask in which all the extracted combinations are arranged as character apertures by extracting combinations of neighboring standard cells from semiconductor device pattern data so as to be contained within the largest beam size, taking the directions of the standard cells into consideration.

TABLE 1

| Exposure method | No. of shots (×10³) | Standardization of No. of shots using mask A | Standardization of No. of shots using mask B |
|---|---|---|---|
| Mask A (conventional) | 20 | 1.000 | — |
| Mask B (with aperture arranged according to their shapes) | 12 | 0.600 | 1.000 |
| mask C (for collectively exposing combinations of SCs appearing more than ten times) | 9.9 | 0.495 | 0.825 |
| mask D (for collectively exposing all combinations of SCs) | 8.3 | 0.415 | 0.692 |

As shown in Table 1, the total number of shots can be effectively reduced by arranging any of the masks B, C and D, in which character apertures are arranged according to their respective outer shapes to an EB exposure system having the variable beam size.

As described above, since the outer shape of each character aperture arranged in the character aperture mask is variable as compared with usual character projection system, a large number of character apertures can be arranged in one aperture block, thereby increasing characters to be exposed.

In the instance of Table 1, the number of shots can be reduced by about 40% if compared with the use of any conventional CP exposure method. An additional reduction of 20 to 30% can be realized because a plurality of character apertures are contained within the beam size to be applied to the character aperture mask and are collectively employed.

The number of character apertures disposed in the aperture block, or the deflection area of the character selection deflector, can be increased since the beam to be applied to the character aperture mask is provided by the rectangle having a desired size. As a result, the number of character apertures capable of carrying out the exposure by a single shot can be increased, while the rate of the variable shaping beam system, in which the beam is divided into a plurality of very small rectangles, can be reduced. Accordingly, the number of shots of the electron beam are remarkably reduced to increase the throughput.

Further, when a plurality of character apertures are contained within the beam size to be applied to the character aperture, the number of shots can be further reduced because the collective exposure becomes possible. Therefore, the throughput of the overall exposure can be improved.

Now, the second embodiment of the invention will be described below.

In the case where a plurality of standard cells are exposed by one shot by using the arrangement of character apertures and the exposure method described above by the first embodiment, this embodiment will describe the extraction of the neighboring standard cells and the arrangement of the character aperture mask.

As described in the first embodiment, the number of shots of electron beam can be effectively reduced when two or more standard cells arranged adjacent to one another are disposed in the character aperture mask.

Figure 7:
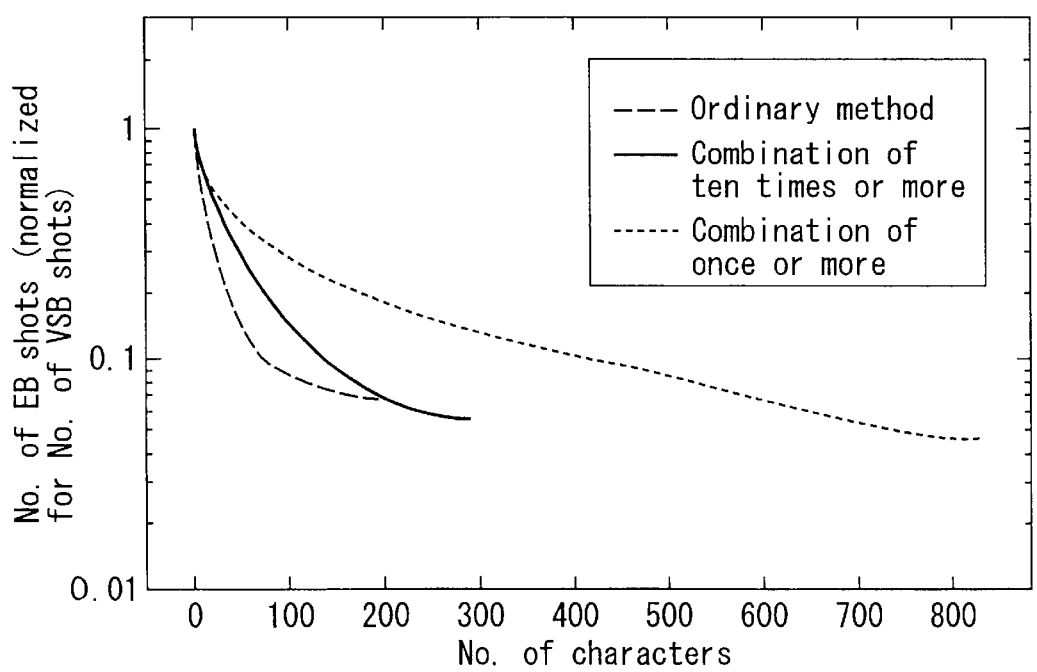
FIG. 7 is a graph illustrating the change in the number of overall electron beam shots relative to the number of character apertures.

However, there arises a problem of increase of character apertures to be arranged in the character aperture mask. FIG. 7 shows a graph illustrating how the number of shots of electron beam changes as a function of the number of character apertures to be exposed by the CP method for a functional block of the ASIC product. As seen from FIG. 7, additional character apertures have to be arranged in the character aperture mask as character apertures are extracted from combination patterns of adjacent standard cells. When the combination patterns existing one or more in the patterns are provided as the character apertures, more than 800 character apertures are needed to expose all the patterns by means of the character projection method.

In other words, as the number of character apertures to be collectively exposed increases, the number of character apertures to be arranged in the character aperture mask will increase accordingly. The effect of reducing the number of EB shots cannot be realized satisfactorily with a limited number of character apertures.

Assume here that the exposure system shown in FIG. 2 and adapted to irradiate a part of the character aperture as shown in FIG. 5 with the beam is used. Then, a single standard cell can be selected from the character apertures formed by combining character apertures that are to be exposed collectively.

Then, it is no longer necessary that the character aperture, used to expose the single standard cell contained in the other character aperture, is prepared on the aperture mask.

While the expression of "characters carrying out the character projection exposure are extracted from standard cells" is used in the above description, it is the shape of the pattern in the case where the standard cells are arranged. For example, when the arrangement of the standard cells shown in FIGS. 8A through 8D is achieved, there are four kinds of pattern directions. Therefore, these patterns need to be extracted as different characters. If only the shape of the properly arranged pattern as shown in FIG. 8A is provided in a character aperture mask, it is not possible to turn and invert the beam shaped by only the pattern of the character aperture mask as shown in FIGS. 8B through 8D, respectively.

Thus, the combination patterns of adjacent standard cells need to be extracted by taking the directions of the standard cells (properly arranged and inverted) into consideration. The combinations should not increase the number of shots if compared with the number of shots required for exposing each standard cell independently. For example, a flip-flop circuit requires two shots in the beam size and hence it is necessary to employ two characters for the exposure. If a small standard cell is arranged adjacent to the flip-flop circuit and these are treated as one of the characters, the total number of character apertures necessary for the flip-flop circuit remains to be equal to two. The latter character for carrying out the collective exposure is employed.

Now, a combination pattern of neighboring standard cells that appears ten times or more in a semiconductor device pattern will be discussed below.

Table 2 below shows the total number of shots (VSB shots) required for forming the patterns with the variable beam shaping (VSB) method, for a combination of standard cells, the number of character apertures extracted from the pattern of the combination (equivalent to the number of shots), and the number of times that the combination appears in the circuit pattern.

whereas, if the same standard cells are arranged consecutively, it is denoted by "x".

While 211 character apertures are needed for usual exposure in FIG. 7. When these extracted combinations are exposed as characters, 234 characters, which are obtained by adding 23 of the total number of the character apertures to 211 character apertures, need to be prepared. However, the standard cells included in the characters for accomplish the collective exposure in Table 2 can form the beams having their shapes by partly applying the beam to the characters as described above. Therefore, when the 23 characters for carrying out collective exposure are arranged in a character aperture mask, it is no longer necessary to prepare characters for exposing the standard cells included therein independently in the character aperture mask. Thus, by removing the duplicates, it will be known that a total of 215 characters are required.

This means that the net increase of character apertures is only equal to four relative to the 211 character apertures needed for exposure when the conventional exposure method involving no collective exposure technique is used. Additionally, since the number of EB shots is same as the number cited above by referring to the first embodiment, the number of shots can be reduced significantly by slightly increasing the number of character apertures.

It is now possible to prepare a character aperture mask optimally adapted to exposure by arranging the combinations of standard cells extracted in a manner as described above in a character aperture mask.

To the contrary, in the case where the combinations of standard cells that appear once or more and that are effective for reducing the number of shots as described above by referring to the first embodiment, while 211 characters that correspond to the number of ordinary character apertures not adapted to collective exposure may be removed from more than 800 characters as duplicates, all the pattern cannot be

TABLE 2

| combination of standard cells | No. of VSB shots | No. of apertures | No. of appearance |
|---|---|---|---|
| AND-OR$_1$ (normal position) × 2 | 50 | 1 | 81 |
| AND-OR$_1$ (turned by 180°) × 2 | 50 | 1 | 60 |
| AND-OR$_2$ (normal position) × 2 | 28 | 1 | 48 |
| AND-OR$_1$ (upside down) × 2 | 50 | 1 | 33 |
| INVERTER$_1$ (turned by 180°) × 4 | 16 | 1 | 29 |
| FLIP FLOP (normal position) + INVERTER$_2$ (normal position) | 115 | 2 | 26 |
| AND-OR$_1$ (normal position) + AND-OR$_2$ (normal position) | 39 | 1 | 26 |
| INVERTER$_1$ (normal position) × 4 | 16 | 1 | 24 |
| AND-OR$_2$ (normal position) + AND-OR$_1$ (normal position) | 39 | 1 | 20 |
| AND-OR$_1$ (normal position) + OR (normal position) | 35 | 1 | 20 |
| AND-OR$_2$ (turned by 180°) × 2 | 28 | 1 | 20 |
| FLIP FLOP (upside down) + INVERTER$_2$ (turned by 180°) | 115 | 2 | 19 |
| OR (normal position) + AND-OR$_1$ (normal position) | 39 | 1 | 18 |
| AND-OR$_1$ (turned by 180°) + AND-OR$_2$ (turned by 180°) | 39 | 1 | 15 |
| AND-OR$_2$ (turned by 180°) + AND-OR$_1$ (turned by 180°) | 39 | 1 | 15 |
| AND-OR$_1$ (turned by 180°) + INVERTER-NOR (turned by 180°) | 42 | 1 | 13 |
| AND-OR$_1$ (normal position) + INVERTER-NOR (normal position) | 42 | 1 | 13 |
| AND-OR$_2$ (upside down) × 2 | 28 | 1 | 11 |
| AND-OR$_1$ (normal position) + INVERTER-NOR (upside down) | 42 | 1 | 10 |
| AND-OR$_1$ (turned by 180°) + INVERTER-NOR (upside down) | 42 | 1 | 10 |
| INVERTER$_1$ (upside down) × 2 | 8 | 1 | 10 |

In the combinations listed in Table 2, the denomination of each standard cell and the direction of arrangement thereof are listed in combination. If one standard cell is arranged adjacent to a different standard cell, it is denoted by "+"

subjected to exposure with the CP method unless about 600 characters are prepared. Thus, it will be seen that a large number of characters as listed in FIG. 7 has to be prepared in the character aperture mask in order to achieve the effect of reducing the number of shots.

As pointed out above, when adjacently arranged standard cells are exposed collectively, combinations of standard cells need to be extracted under the condition of either:

combinations of standard cells that appear once or more are used as the characters; or combinations of standard cells that appear ten times or more are used as the characters.

In this way, characters can be extracted by using the frequency of appearance of each combination of standard cells as parameter.

Then, as pointed out above, a large number of shots can be eliminated by the increase of four characters as described in the first embodiment when combinations of standard cells that appear ten times or more are used as the characters. In other words, this can be assumed as an optimum case capable of reducing the number of shots by the collective exposure without increasing the number of character apertures almost.

Two kinds of combinations of standard cells having one and ten times in the appearance frequency of the device patterns have examined above. However, by carrying out the optimization due to a large number of the appearance frequency corresponding to the patterns to be exposed, it can be possible to reduce greatly the number of character apertures and to decrease greatly the number of shots.

While the appearance frequency of each combination is used as parameter for extraction in the above description, more detailed parameters may alternatively be used for calculation in order to achieve great effect of reducing the number of shots by collective exposure. More specifically, for example, in the combination of a plurality of standard cells arranged adjacent to one another, calculated is the difference between the number of shots in the case where individual standard cells are independently exposed and the number of shots in the case where a plurality of the standard cells are collectively exposed. After multiplying the difference by the appearance frequency, the effect of reducing the shots can be calculated in the case where the combination is used as to characters.

Typical combinations will be drawn from the above combinations of standard cells and shown in Table 3 below.

TABLE 3

| Combination | No. of shots | | No. of appearances | Reduction effect |
| --- | --- | --- | --- | --- |
| | Individual exposure | Collective exposure | | |
| AND-OR$_1$ (normal position) × 2 | 2 | 1 | 81 | 81 |
| INVERTER$_1$ (turned by 180°) × 4 | 4 | 1 | 29 | 87 |

It will be found that the number of appearances and the effect of reducing number of shots are inverted as shown in Table 3.

Thus, with regard to the character projection type electron beam lithography for accomplishing the exposure using the standard cells as the characters, it is possible to reduce the number of EB shots by extracting combinations of adjacently arranged standard cells that can be collectively subjected to exposure as in the case of the above examples. However, the number of character apertures to be arranged in a character aperture mask may be increased depending upon the extracting condition.

However, the number of characters that can be arranged in the character aperture mask, which are expressed in terms of the sum of the areas of the characters in the above embodiment, is limited due to the restrictions particular to the exposure system. In this case, the effect of reducing the number of shots will be rather reduced if the sufficient number of characters cannot be prepared in the character aperture mask.

On the other hand, the effect of reducing the number of shots according to the exposure in the above embodiment can be maximized by extracting the characters from adjacently arranged standard cells in such a manner that the number of the character apertures or the sum of the character areas to be prepared on the character aperture mask is minimized, and by setting a condition for extracting the characters therefrom so as to carry out to exposure by the number of shots less than the number of standard cells. The time required for exposing the pattern can be reduced to maximally improve the throughput of the exposure.

Now, the third embodiment of the invention will be described below.

As described above, when an exposure system as illustrated in FIG. 2 is used for producing contact holes in a semiconductor device, any desired number of hole patterns can be collectively transferred by arranging apertures of a hole array in the character aperture 213 and applying the beam to a part of the aperture mask. As a result, the number of the exposures can be remarkably reduced as compared with the use of a variable beam shaping method of exposing holes one by one. Additionally, such an exposure technique can be applied to any desired number of hole arrays as compared with a case of preparing separate character apertures as the number of hole arrangements. As a result, the kinds of the characters to be arranged in the aperture can be increased and the ratio of the patterns to be exposed by using a character beam can be also raised, thereby reducing the number of shots and improving the exposure throughput.

In order the realize such exposure system, the exposure data will be required for selectively applying an electron beam to character apertures. The exposure data will be produced below.

FIG. 9 is a flow chart for explaining a method of producing the exposure data by using the electron beam.

Referring to FIG. 9, in the first step (P1), at least a pair of opposite sides of a design pattern is moved outwardly by a specified distance. In the case of a contact hole pattern, all the sides are moved outwardly by a specified distance. Then, in the second step (P2), overlaps among patterns produced as a result of the P1 step are removed and the patterns are merged (P2). Subsequently, in the third step (P3), the merged pattern as a result of the P2 step is divided into a plurality of rectangles. Thereafter, in the fourth step (P4), an electron beam is shaped according to the rectangular data obtained by the P3 step, and the shaped electron beam is partly applied to the pattern apertures of the character aperture mask 213.

Figure 10:
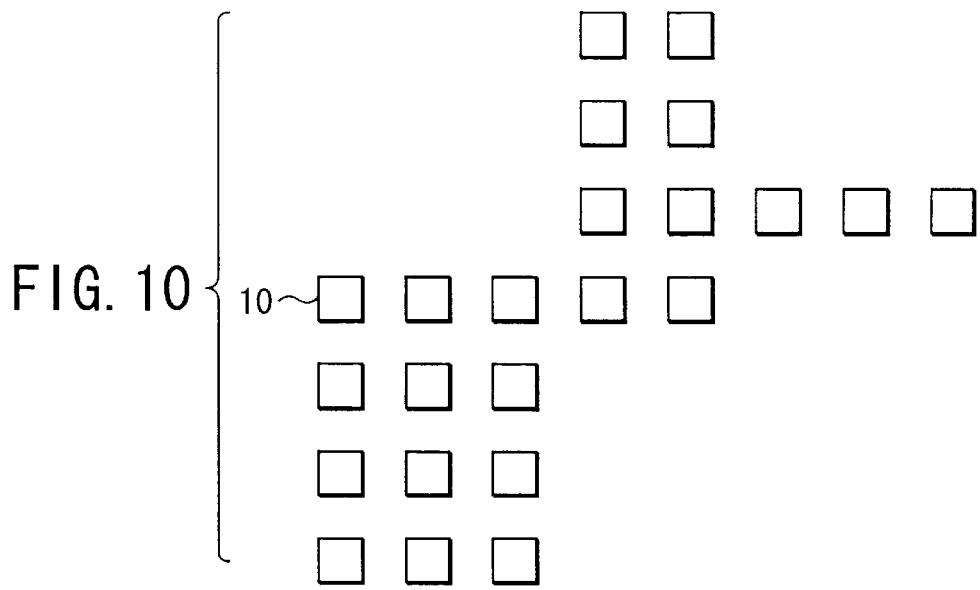
FIG. 10 is an illustration showing one example of design patterns of contact holes to be exposed.

Now, each operation of the steps will be described further by referring to FIG. 10 illustrating a pattern of contact holes of a semiconductor device.

A design pattern shown in FIG. 10 includes a plurality of hole patterns 10 in which.

Figure 11:
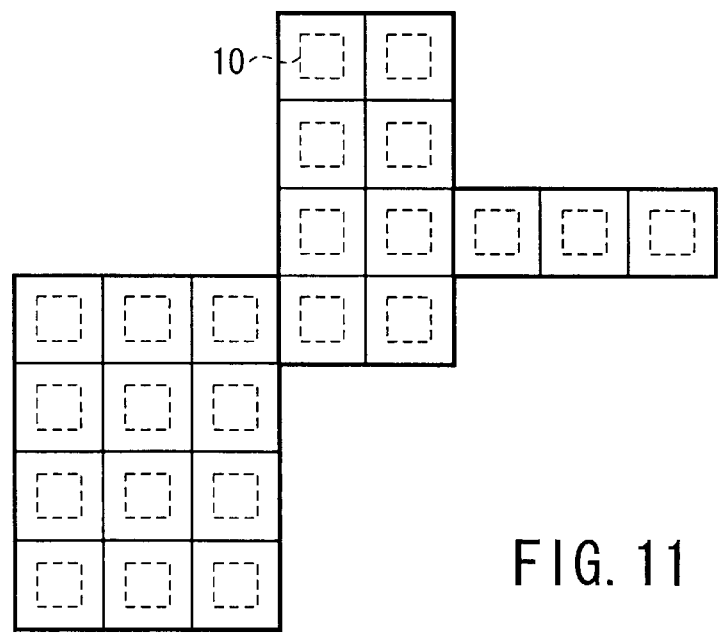
FIG. 11 is an illustration showing patterns obtained by moving the sides of the patterns outwardly by ¼ of an arranged pitch according to a P1 step.
Figure 12:
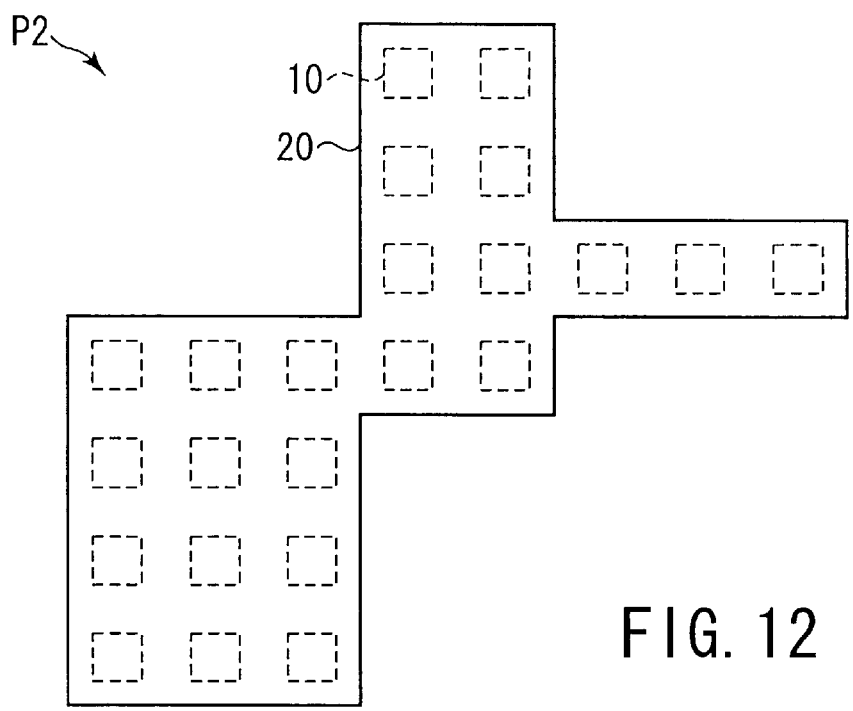
FIG. 12 is an illustration showing a pattern obtained by removing the overlap of the patterns of FIG. 11 and merging them according to a P2 step.
Figure 13:
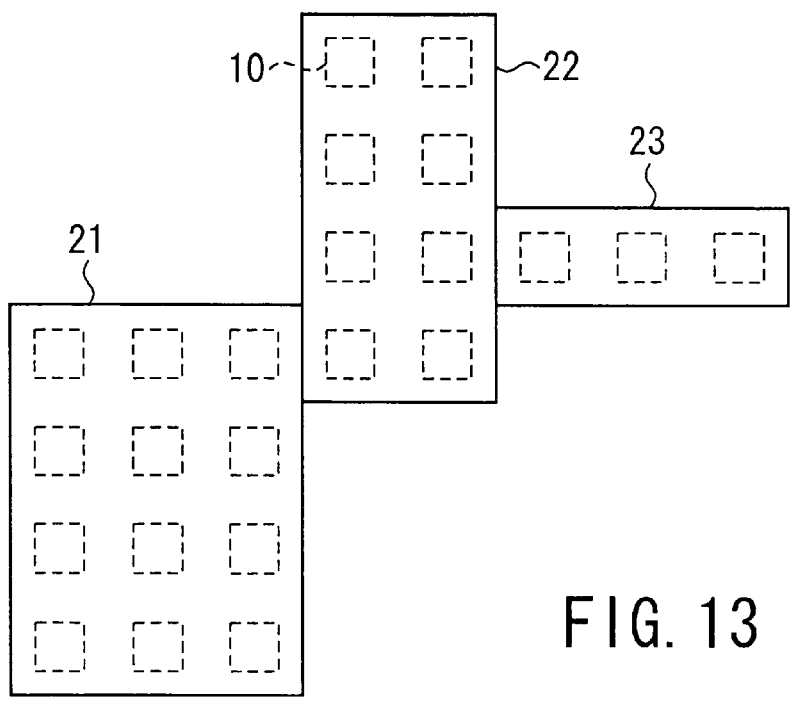
FIG. 13 is an illustration showing a condition by dividing the merged pattern into rectangular patterns according to a P3 step.

Each of the hole patterns and its pitch have a ratio of 1:2. However, the ratio does not necessarily need to be 1:2. The design pattern of FIG. 10 is subjected to the operation of the step P1 to move outwardly the sides of each hole pattern 10 in the design data as shown in FIG. 11. In the instance of FIG. 11, the sides are moved outwardly by ½ of a distance between two adjacent hole patterns. As a result, two adjacent hole patterns adjoin with each other. Then, the design pattern is subjected to the operation of the step P2 to remove the overlaps of the hole patterns 10 and to merge the hole patterns 10, thereby producing a single merged pattern 20 as shown in FIG. 12. Subsequently, the merged pattern 20 is subjected to the operation of the step P3 to divide it into a plurality of rectangles 21, 22, 23 as shown in FIG. 13.

Then, in the step P4, an electron beam is shaped depending upon the rectangular data obtained as a result of the step P3 and the shaped electron beam is applied to the character aperture. In the case of the exposure system of FIG. 2, the optical overlap of the first and second shaping apertures 206, 210 is controlled by the shaping deflector 208, and the shaped aperture image (electron beam) is applied to the predetermined region of the character aperture mask 213 by means of the character selection deflector 212.

Figure 14A:
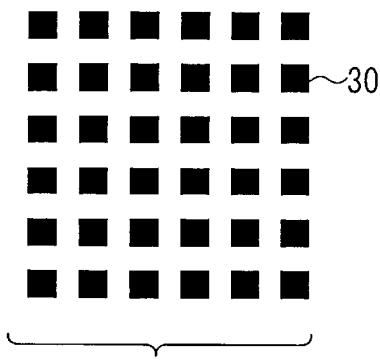
FIGS. 14A through 14D are illustrations for explaining character apertures and rectangular beams to be applied to the character apertures.
Figure 14B:
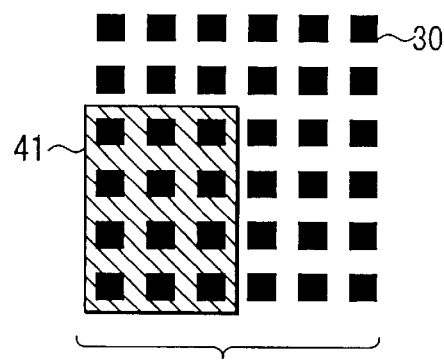
Figure 14C:
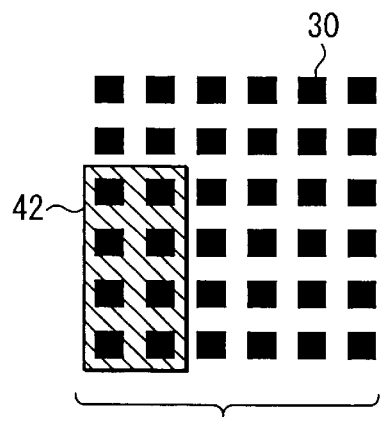
Figure 14D:
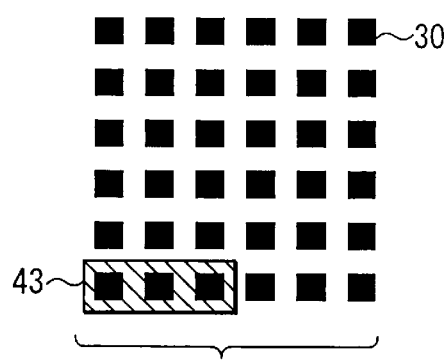

FIGS. 14A through 14D show character holes (FIG. 14A) arranged in the form of a matrix and irradiated conditions of the beam (FIGS. 14B through 14D). As shown in FIGS. 14A through 14D, the character holes are arranged corresponding to the hole size and the pitch of the design pattern. The shaped electron beam is applied to a part of the character holes so that a part of the character hoes is transferred on a sample.

Note that, in FIGS. 14A through 14D, the black-coated areas 30 show contact holes and each of the hatched areas 41, 42, 43 shows a rectangular beam. FIGS. 14B, 14C, 14D correspond to rectangular beams 41, 42, 43, respectively. The lower left corner of the drawings is used as the origin of the coordinates for the rectangular beam. A group of contact holes with different pitch may be provided to a plurality of regions.

Figure 15A:
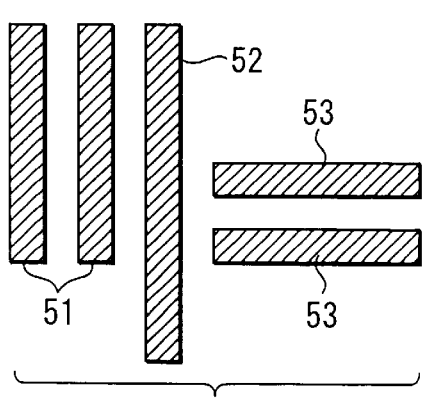
FIGS. 15A and 15B are illustrations showing an example for producing exposure data from patterns of wiring layers.
Figure 15B:
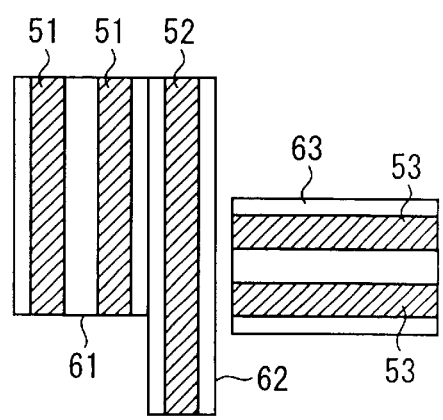
Figure 16:
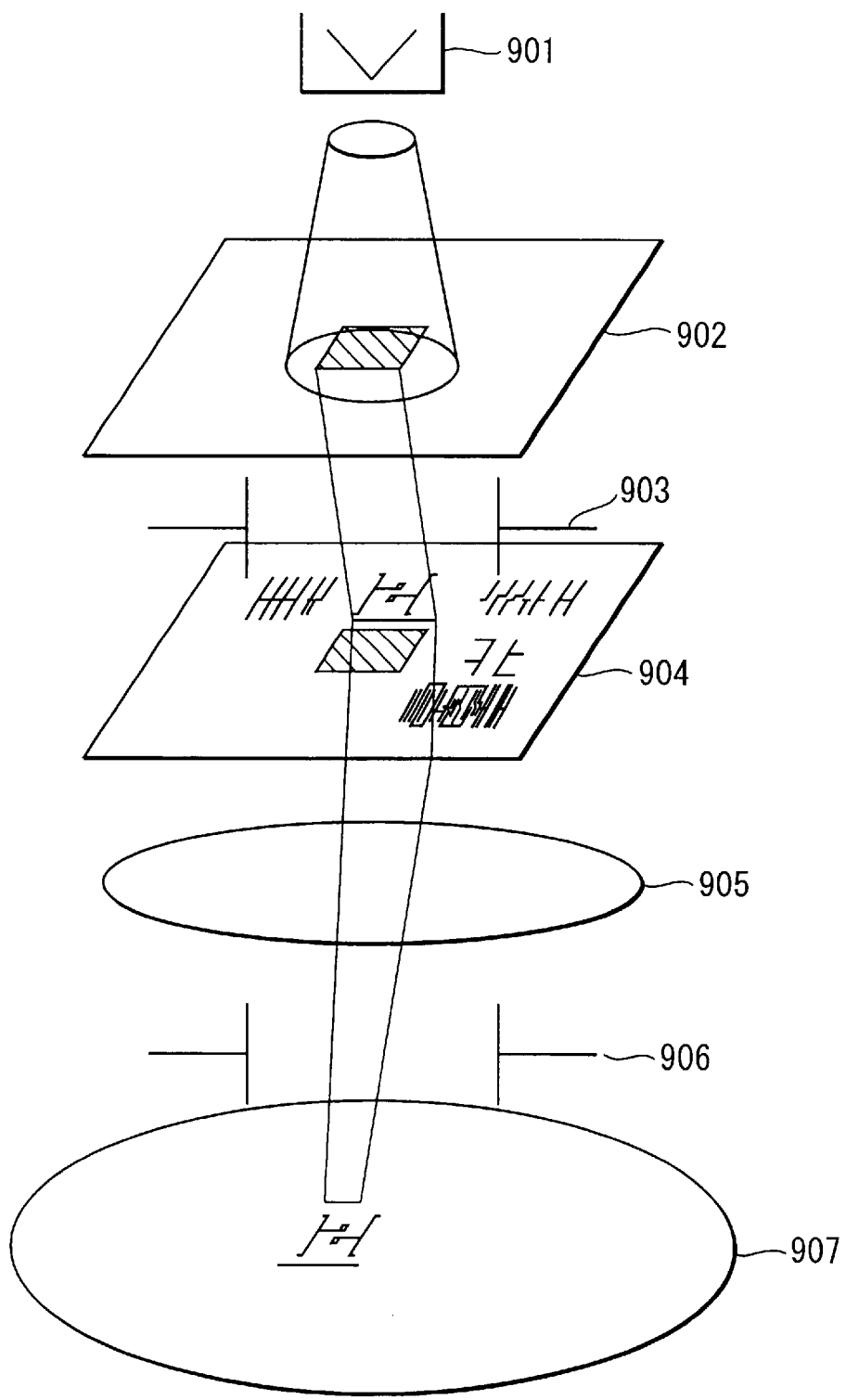
FIG. 16 is a schematic illustration showing a conventional electron beam exposure system.

FIGS. 15A and 15B show a method of producing exposure data from a pattern of wiring layers of a semiconductor device, in which the width of each wiring layer and its pitch are defined by a ratio of 1:2 as in the case of the above described contact holes.

As shown in FIG. 15A, the design pattern includes two wiring patterns 51 extending longitudinally and having the same length, a wiring pattern 52 longer than the wiring patterns 51 and two writing patterns 53 extending transversally and having the same length.

By applying the steps P1 through P3 to the design pattern, rectangular data divided into a plurality of rectangles 61, 62 and 63 is obtained as shown in FIG. 15B. In this case, only a pair of opposite sides of the wiring patterns, which are in parallel with the wiring direction, are moved outwardly in the step P1.

According to the embodiment, rectangular data surrounding a plurality of hole patterns can be easily obtained. Further, since the electron beam is shaped depending upon the rectangular data, it can be possible to produce control data for providing a various kinds of shapes from one kind of the holes or a character apertures.

Three kinds of transfers are shown in FIGS. 14A through 14D as the example. In this case, the hole patterns containing 12, 8 and 3 holes respectively is transferred by a single operation of the beam application. In the case of using the variably shaped beam method, a total of 23 operations of the beam application are required. On the other hand, with this embodiment, only three operations of the beam application are needed to reduce the number of the exposure to $1/8$.

Additionally, a total of 36 beams having different cross sections can be produced by using the 6×6 character holes arranged in array as shown in FIGS. 14A through 14D and by applying the beam to a part thereof. On the contrary, with the conventional character projection method, 36 different character holes need to be formed in a character aperture mask when the same kinds of the character beams are produced. However, 36 kinds of beams can be produced by only one kind of the hole in the character projection type exposure system according to the embodiment. Thus, 35 of unoccupied spaces will be provided on the character aperture as compared with a conventional exposure system. Accordingly, it can be possible to provide holes with different shapes (e. g., holes with different sizes or different pitches) to the unoccupied spaces, thereby producing beams with many kinds of shapes. Then, the exposure system will improve the throughput as compared with conventional ones. As a result, the ratio of the patterns capable of exposing by the characters can be increased, thereby remarkably reducing the total number of exposure operations.

The present invention is not limited to the above described embodiments. Though the contact hole patterns and wiring patterns are employed as the patters to be formed to character apertures in the embodiments, the present invention can be applied to any other patterns. Furthermore, the exposure apparatus used in the present invention is not limited to those shown in FIG. 2, which may be modified appropriately depending on the specification of the aperture mask to be used. The present invention is not limited to the use of an electron beam exposure system, but may be applied to an ion beam exposure apparatus.

The techniques described above embodiments may be used as a program for operating a computer. Then, the program may be stored in a recording medium such as a magnetic disk (floppy disk, hard disk, etc.), an optical disk (CD-ROM, DVD, etc.) or a semiconductor memory. Additionally, it may be transmitted through a communication medium and may be applied to various apparatus. The processing described above may be executed by reading the program stored in the recording medium and by controlling the operation.

According to the invention as described above, it is possible to increase the number of characters that can be arranged in an aperture mask by shaping a beam to be applied to a character aperture mask corresponding to character apertures and by arranging characters in the aperture mask according to the shape of the character apertures.

As a result, the number of apertures capable of exposing by one shot will be increased. Conversely, the ratio of the number of shots using the variably shaped beam method, which is divided into a plurality of minute rectangles to carry out the exposure, will be reduced. Accordingly, the total number of EB shots can be remarkably reduced to improve the throughput of the exposure operation.

Additionally, when a plurality of characters can be contained within the beam size to be applied to the character aperture mask, they can be collectively exposed to further reduce the number of shots, and the exposure throughput can be greatly improved.

Still additionally, exposure data for simultaneously selecting a plurality of aperture patterns in a character aperture can be produced by way of relatively simple steps, which includes outwardly moving at least a pair of opposite sides of a design pattern by a specified distance, removing the overlap between patterns and merging the patterns, and dividing the obtained pattern into a plurality of rectangle. Thus, control data to for selectively applying the charged particle beam to the character aperture can be easily produced to improve the efficiency of exposure.

Furthermore, it has been expected that any desired number of hole patterns is collectively transferred by using first and second apertures for beam shaping and a third aperture for characters, thereby remarkably reducing the number of exposures as compared with the variable shaping beam system. However, no method for producing exposure data to realize such an exposure method has been provided. However, according to the present invention, it is possible to easily produce the exposure data for selectively applying the charged particle beam to the character aperture. Then, it can be possible to provide a charged particle beam exposure method and an exposure data production method for improving the efficiency of exposure and also a recording medium storing an exposure program.

The present invention is not limited to the above embodiments. Thus, the above embodiments can be modified in various different ways without departing from the scope of the present invention.

What is claimed is:

1. A method of producing exposure data used for a charged particle beam exposure data for simultaneously transferring a plurality of rectangular aperture patterns on a sample by selectively applying a charged particle beam to character apertures including periodically arranged said aperture patterns and for defining a shape of said charged particle beam to be applied to said character apertures, said method comprising:

preparing a design pattern comprised of a plurality of rectangular hole patterns;

outwardly moving at least a pair of opposite sides of each of said hole patterns by a specified distance;

removing the overlap among said hole patterns to form a merged pattern;

dividing said merged pattern into a plurality of rectangles; and providing said rectangles as exposure data.

2. The method according to claim 1, wherein the distance of movement of the sides of each of said hole patterns is a half of a spaced distance of a pattern arrangement.

3. The method according to claim 1, wherein said aperture patterns are rectangular contact hole patterns, and wherein each of the opposite sides of each of said hole patterns are moved by said specified distance in a moving step.

4. The method according to claim 1, wherein said aperture patterns are linear wiring patterns, and wherein a pair of the opposite sides of each of said wiring patterns which are parallel with respect to a wiring direction are moved by a specified distance in said moving step.

5. A computer-readable recording medium which stores a program for controlling a charged particle beam exposure system by means of a computer and for selectively applying a charged particle beam to character apertures including periodically arranged rectangular aperture patterns with predetermined shapes, thereby transferring a plurality of said aperture patterns to a sample, said program for producing exposure data for defining a shape of said charged particle beam to be applied to said character apertures, said program controlling said computer to execute the following:

a first step of preparing a design pattern comprised of a plurality of rectangular hole patterns;

a second step of outwardly moving at least a pair of opposite sides of each of said hole patterns by a specified distance;

a third step of removing the overlap among said hole patterns to form a merged pattern;

a fourth step of dividing said merged pattern into rectangles; and a fifth step of providing said rectangles as exposure data.

* * * * *